United States Patent
Lu

(10) Patent No.: US 10,424,750 B2
(45) Date of Patent: Sep. 24, 2019

(54) STRETCHABLE DISPLAY PANEL, MANUFACTURING METHOD THEREOF, AND STRETCHABLE DISPLAY APPARATUS

(71) Applicant: SHENZHEN CHINA STAR OPTOELECTRONICS TECHNOLOGY CO., LTD., Shenzhen, Guangdong (CN)

(72) Inventor: Macai Lu, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/032,031

(22) Filed: Jul. 10, 2018

(65) Prior Publication Data

US 2019/0207131 A1    Jul. 4, 2019

Related U.S. Application Data

(63) Continuation of application No. PCT/CN2018/077086, filed on Feb. 24, 2018.

(30) Foreign Application Priority Data

Dec. 31, 2017 (CN) .......................... 2017 1 1499360

(51) Int. Cl.
*G06F 1/16* (2006.01)
*H01L 51/00* (2006.01)
(Continued)

(52) U.S. Cl.
CPC ...... *H01L 51/0097* (2013.01); *H01L 27/3246* (2013.01); *H01L 27/3276* (2013.01);
(Continued)

(58) Field of Classification Search
CPC .......................... G06F 1/1652; G06F 1/1641
See application file for complete search history.

(56) References Cited

U.S. PATENT DOCUMENTS

| 8,203,261 B2 | 6/2012 | Tanaka et al. |
| 9,341,873 B2 | 5/2016 | Chen et al. |

(Continued)

FOREIGN PATENT DOCUMENTS

| CN | 102593095 A | 7/2012 |
| CN | 106601133 A | 4/2017 |

(Continued)

*Primary Examiner* — Thomas L Dickey

(57) ABSTRACT

A stretchable display panel, a manufacturing method of the stretchable display panel and a stretchable display apparatus are provided. The manufacturing method of the stretchable display panel includes: providing a first substrate; defining a plurality of pixel regions and a plurality of stretchable regions in the first substrate; each stretchable region being located between two adjacent pixel regions; forming a pixel device in each pixel region, and forming a conducting wire connecting two adjacent pixel regions in each stretchable region; wherein a length of the conducting wire is greater than a distance between two adjacent pixel regions. In this way, the stretchable display panel may achieve a great amount of deformation, and the display panel can be bent conveniently.

14 Claims, 7 Drawing Sheets

(51) Int. Cl.
*H01L 51/52* (2006.01)
*H01L 51/56* (2006.01)
*H01L 27/32* (2006.01)

(52) U.S. Cl.
CPC ........ *H01L 51/003* (2013.01); *H01L 51/5253* (2013.01); *H01L 51/56* (2013.01); *H01L 2227/323* (2013.01); *H01L 2227/326* (2013.01); *H01L 2251/5338* (2013.01)

(56) References Cited

U.S. PATENT DOCUMENTS

| | | | |
|---|---|---|---|
| 9,478,562 B2 | 10/2016 | Long et al. | |
| 2009/0051640 A1* | 2/2009 | Tanaka | G02F 1/136286 345/92 |
| 2017/0233606 A1* | 8/2017 | Park | H01L 27/3244 428/327 |
| 2018/0130966 A1* | 5/2018 | Yun | H01L 27/3246 |

FOREIGN PATENT DOCUMENTS

| | | |
|---|---|---|
| CN | 107424520 A | 12/2017 |
| WO | 2011122120 A1 | 10/2011 |

* cited by examiner

STRETCHABLE DISPLAY PANEL, MANUFACTURING METHOD THEREOF, AND STRETCHABLE DISPLAY APPARATUS

CROSS-REFERENCE TO RELATED APPLICATIONS

The present application is a continuation application of International (PCT) Patent Application No. PCT/CN2018/077086 filed Feb. 24, 2018, which claims foreign priority of Chinese Patent Application No. 201711499360.0, filed on Dec. 31, 2017 in the State Intellectual Property Office of China, the entire contents of which are hereby incorporated by reference.

TECHNICAL FIELD

The described embodiments relates to the liquid crystal panel technology, and more particular, to a stretchable display panel, a manufacturing method of the stretchable display panel and a stretchable display apparatus.

BACKGROUND

Organic light emitting diode (OLED) displaying technology is a technology that uses reversible discoloration generated by organic functional materials when the organic functional materials are driven by currents to achieve displaying. OLED displays have the advantages of ultra-light, ultra-thin, high brightness, large viewing angle, low voltage, low power consumption, fast response, high definition, seismic resistance, bendability, low cost, simple processes, low raw materials consumption, high luminous efficiency, wide temperature range, and the like, and has been considered to be the most promising new generation of display technology.

OLED flexible displays currently known can achieve neither spherical bending, nor stretching. Therefore, the OLED flexible displays cannot be applied to the applications that requires stretching deformation or spherical bending deformation

SUMMARY

A stretchable display apparatus, a manufacturing method of the stretchable display panel and a stretchable display apparatus are provided in the present disclosure, such that the stretchable display panel may achieve a great amount of deformation, and the display panel can be bent conveniently.

In order to solve the technical problem above, a technical solution is adopted in the present disclosure. In this aspect, a stretchable display apparatus is provided. The stretchable display apparatus may include a stretchable display panel. The stretchable display panel may include a plurality of pixel regions and a plurality of stretchable regions, and each stretchable region may be located between two adjacent pixel regions. A pixel device may be arranged in each pixel region; at least one columnar protrusion may be arranged in each stretchable region; a conducting wire connecting the two adjacent pixel regions may be arranged on a surface of the at least one columnar protrusion.

In order to solve the technical problem above, another technical solution is adopted in the present disclosure. In this aspect, manufacturing method for a stretchable display panel is provided. The manufacturing method for a stretchable display panel may include: providing a first substrate; defining a plurality of pixel regions and a plurality of stretchable regions in the first substrate; each stretchable region being located between two adjacent pixel regions; forming a pixel device in each pixel region, and forming a conducting wire connecting two adjacent pixel regions in each stretchable region; wherein a length of the conducting wire is greater than a distance between two adjacent pixel regions.

In order to solve the technical problem above, in a further aspect, a further technical solution is adopted in the present disclosure. In this aspect, a stretchable display panel is provided. The stretchable display panel may include a plurality of pixel regions and a plurality of stretchable regions; wherein each stretchable region is located between two adjacent pixel regions; a pixel device is arranged in each pixel region; a conducting wire connecting the two adjacent pixel regions is arranged in each stretchable region; a length of the conducting wire is greater than a distance between two adjacent pixel regions.

Compared with the related art, a manufacturing method of the stretchable display panel may be provided in the present disclosure. The manufacturing method of the stretchable display panel may substantially include: providing a first substrate; defining a plurality of pixel regions and a plurality of stretchable regions in the first substrate, each stretchable region being located between every adjacent pixel regions; forming a pixel device in each pixel region, and forming a conducting wire connecting two adjacent pixel regions in each stretchable region; wherein a length of the conducting wire may be greater than a distance between two adjacent pixel regions. By arranging the conducting wire having a length greater than a distance between two adjacent pixel regions in each stretchable region between two adjacent pixel regions, the stretchable display panel may have a great amount of deformation. In this way, the stretchable display panel may be deformed in a plurality of dimensions without damaging the display characteristic of the stretchable display panel. Therefore, the stretchable display panel may be applied to the display application having greater deformation.

BRIEF DESCRIPTION OF THE DRAWINGS

In order to make the technical solution of embodiments of the present disclosure more clearly, drawings used for the description of the embodiments will be briefly described. Apparently, the drawings described above are only some exemplary embodiments of the present disclosure. One skilled in the art may acquire other drawings based on these drawings without any inventive work.

DETAILED DESCRIPTION

The technical solution of the embodiments of the present disclosure will be described more clearly and completely with reference to the accompanying drawings. Apparently, the embodiments described here only some exemplary embodiments, not all the embodiments. Based on the embodiments described in the present disclosure, one skilled in the art may acquire all other embodiments without any creative work. All these shall be covered within the protection scope of the present disclosure.

The terms "first", "second" and "third" in the present disclosure are merely for illustrative purposes, and should not be construed as indicating or implying the relative importance, or implicitly indicating the number of indicated technical features. Thus, features defined with "first", "second" and "third" may explicitly or implicitly include at least one of the features. In the description of the present disclosure, "a plurality of" means at least two, for example, two, three, etc., unless expressly limited. Moreover, the terms "include", "have" and any variation thereof are intended to encompass the items listed thereafter and equivalents thereof as well as additional items. For example, a process, a method, a system, a product or a device that includes a series of steps or components is not limited to these steps or components already listed, instead, it may optionally include many inherent steps or components not listed here.

The term "embodiment" recited in the present disclosure means that, specific features, structures or properties described with reference to the embodiment can be included in at least one embodiment of the present disclosure. The terms "embodiment" used in different positions of the specification does not always refer to the same embodiment, and does not indicate that this embodiment is the embodiment exclusive and independent from other embodiments, or the alternative embodiment of other embodiments. One skilled in the art may explicitly or implicitly understands that, the embodiment described in the present disclosure can be combined with other embodiments.

Figure 1:
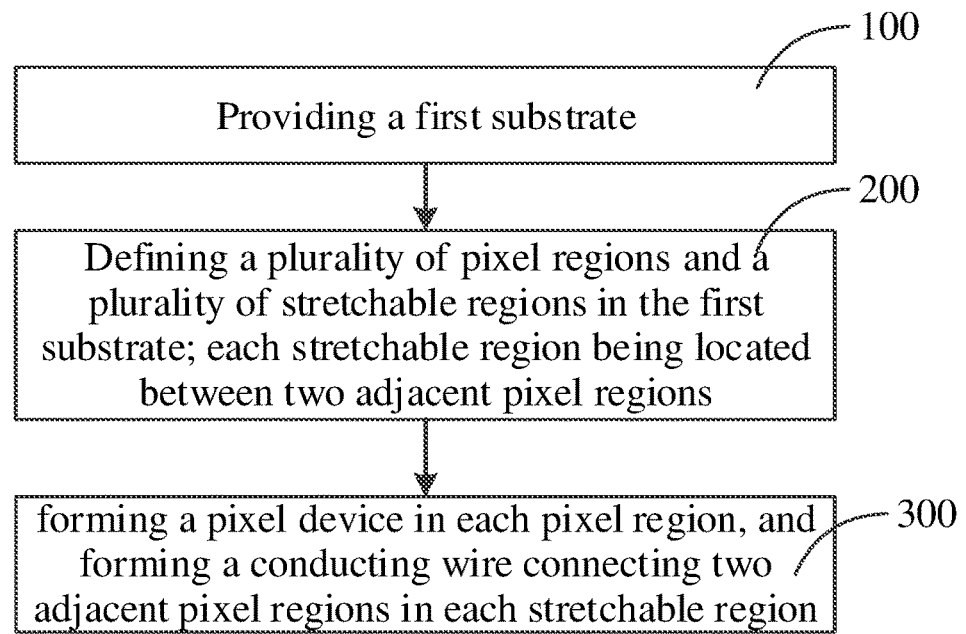
FIG. 1 is a flow chart of a manufacturing method of a stretchable display panel according to one embodiment of the present disclosure.

Referring to FIG. 1, a flow chart of a manufacturing method of a stretchable display panel according to one embodiment of the present disclosure is depicted in FIG. 1.

At block S100: a first substrate may be provided.

In this block, the first substrate 11 may be provided. The first substrate 11 may be a rigid substrate, such as a glass substrate, a rubber substrate, a ceramic substrate or any other substrate formed by material having a good physical property or chemical property and being stable. However, the present disclosure is not limited thereto.

At block S200: a plurality of pixel regions and a plurality of stretchable regions may be defined in the first substrate; wherein each stretchable region is located between two adjacent pixel regions.

Figure 3:
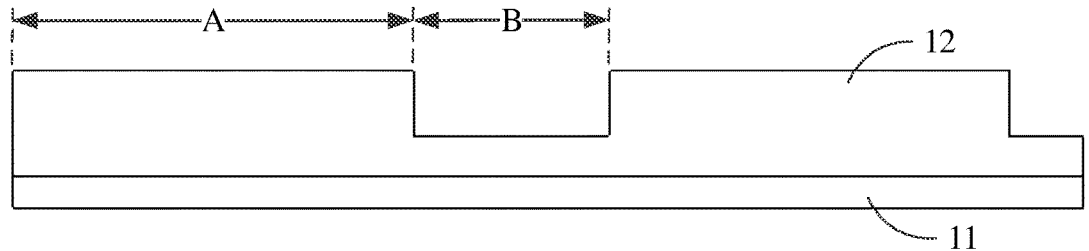
FIG. 3 is a structural view of two pixel regions and a stretchable region according to the embodiment shown in FIG. 2.

The plurality of pixel regions A distributed in array and the plurality of stretchable regions B may be defined in the first substrate 11, wherein each stretchable region B is located between two adjacent pixel regions A. In this embodiment, as shown in FIG. 3, every two adjacent pixel regions A has one stretchable region located therebetween. However, in other embodiment, it is also possible that, only parts of every two adjacent pixel regions A have a stretchable region B located therebetween. That is to say, it is possible that there are least two adjacent pixel regions having no stretchable regions B arranged therebetween.

For example, the plurality of pixel regions A and the plurality of stretchable regions B each of which is located between two adjacent pixel regions A may be formed by using the following methods.

Figure 2:
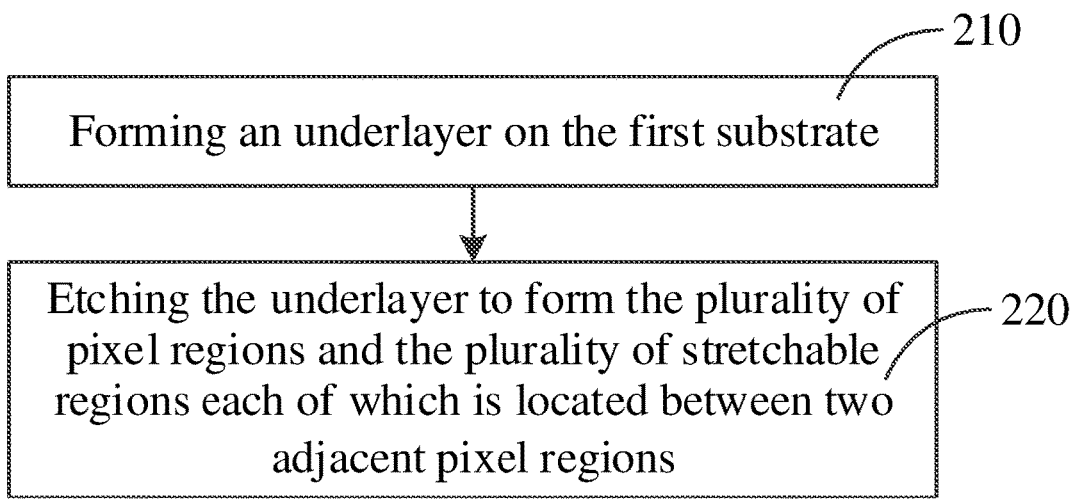
FIG. 2 is a flow chart of the block S200 shown in FIG. 1.

Referring to FIG. 2, a flow chart of the block S200 shown in FIG. 1 is depicted in FIG. 2.

At block S210: an underlayer may be formed on the first substrate.

Referring to FIG. 3, in this embodiment, the first substrate 11 may be the glass substrate. Substrate material, such as polyimide (PI) material, may be coated on the first substrate 11, in order to form the underlayer 12. However, the present disclosure may not be limited thereto.

The underlayer 12 may be a flexible substrate and include a plastic substrate, such as a polyimide substrate, a polyethylene terephthalate (PET) substrate, polyethersulfone (PES) substrate, a polyethylene (PC) substrate, or the flexible substrate made from any other suitable material.

At block S220: the underlayer may be etched to form the plurality of pixel regions and the plurality of stretchable regions each of which is located between two adjacent pixel regions.

Referring to FIG. 3, the underlayer 12 may be etched to form the plurality of pixel regions A and the plurality of stretchable regions B; wherein each stretchable region B is located between two adjacent pixel regions A. In this case, a thickness of a first portion of the underlayer 12 located in each pixel region A may be greater than a thickness of a second portion of the underlayer 12 located in each stretchable region B.

The following blocks may be continued to perform.

At block S300: a pixel device may be formed in each pixel region, and a conducting wire connecting two adjacent pixel regions may be formed in each stretchable region.

The pixel device may be formed in each pixel region A. The pixel device may substantially include a gate electrode, a source electrode, a drain electrode, a gate-insulating layer, a semi-conductive layer and an organic light emitting diode (OLED) device. The conducting wire connecting two adjacent pixel regions A may be formed in each stretchable region B. In this embodiment, a length of the conducting wire may be greater than a distance between two adjacent pixel regions A. The conducting wire may include metal, such as copper, aluminum, metal alloy, or the like. The conducting wire may also include transparent metallic oxide, such as ITO (Indium Tin Oxid), or the like.

For example, the pixel device and the conducting wire may be formed by using the following methods.

Figure 4:
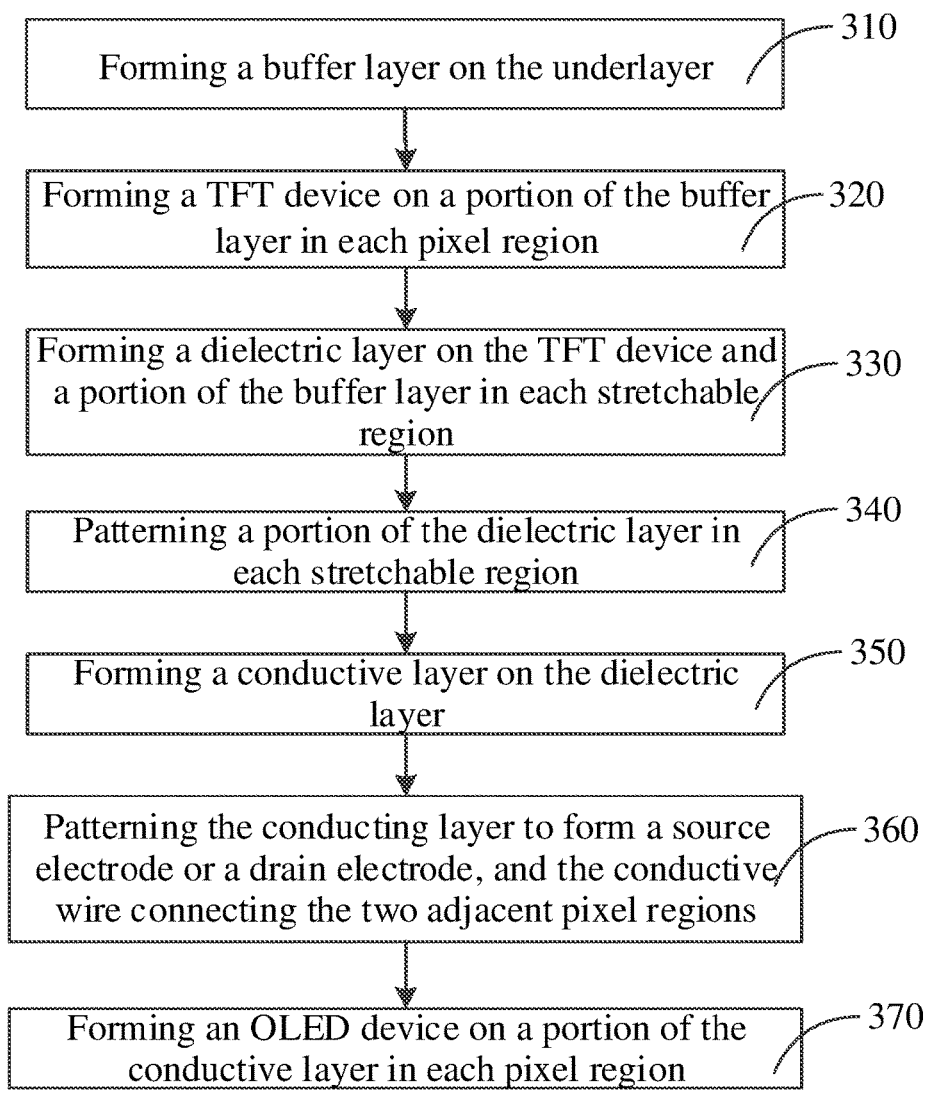
FIG. 4 is a flow chart of the block S300 shown in FIG. 1.

Referring to FIG. 4, a flow chart of the block S300 shown in FIG. 1 is depicted in FIG. 4.

At block S310: a buffer layer may be formed on the underlayer.

Figure 6:
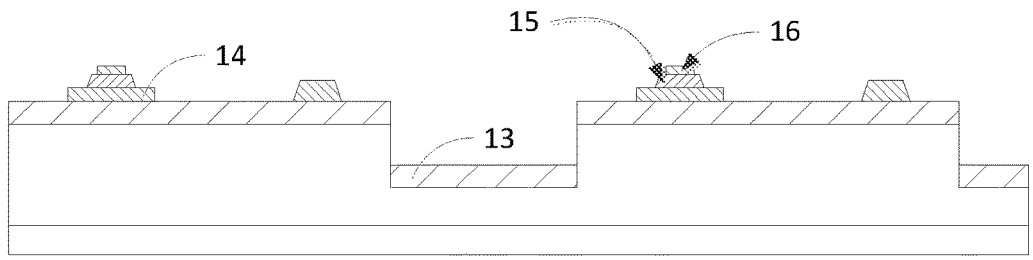
FIG. 6 is a structural view of a thin film transistor (TFT) device according to the embodiment shown in FIG. 5.

Referring to FIG. 6, the buffer layer 13 may be formed on the underlayer 12. The existence of the buffer layer 13 may prevent water and oxygen from penetrating into each pixel region, which may improve the performance of the stretchable display substrate. The buffer layer 13 may be made from silicon nitride, silicon oxide, silicon oxynitride, or any other stable material having similar properties. The present disclosure may not be limited thereto.

In this embodiment, the buffer layer 13 may be made from silicon nitride, and may be fully deposited on the underlayer 12 by using a physical vapor deposition method or a chemical vapor deposition method.

At block S320: a thin film transistor (TFT) device may be formed on a portion of the buffer layer in each pixel region.

The TFT device may be formed on a portion of the buffer layer 13 in each pixel region A. The TFT device may include a semi-conductive layer, a gate insulating layer, and a gate electrode layer.

For example, the TFT device may be manufactured by using the following methods. However, it is also possible for the TFT device to be manufactured by other methods. Further, the configuration of the TFT device manufactured and obtained in the present disclosure are merely illustrative examples. It is possible that the TFT device may have other configuration. The manufacturing method and the configuration of the TFT device may not be limited in the present disclosure.

Figure 5:
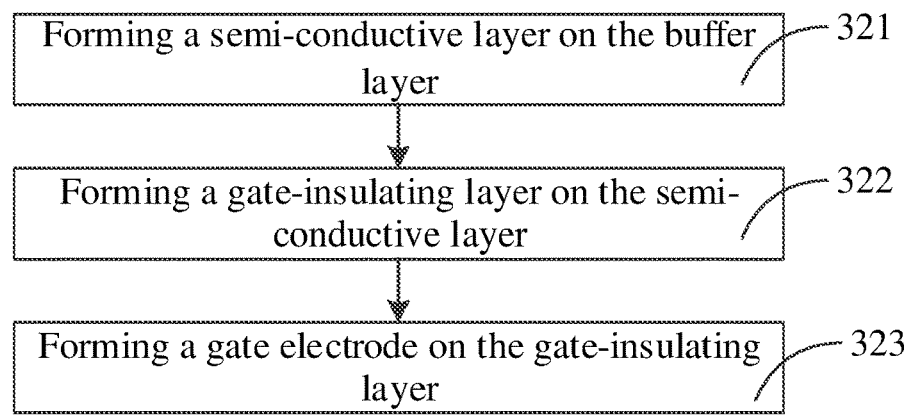
FIG. 5 is a flow chart of the block S320 shown in FIG. 4.

Referring to FIG. 5 and FIG. 6, a flow chart of the block S320 shown in FIG. 4 is depicted in FIG. 5, while a structural view of the TFT device according to the embodiment shown in FIG. 5 is depicted in FIG. 6.

At block S321: the semi-conductive layer may be formed on the buffer layer.

The semi-conductive layer 14 may be formed on the buffer layer 13. The semi-conductive layer 14 may be made from indium zinc oxide or any other suitable material. The semi-conductive layer 14 may be patterned after that. The material of the semi-conductive layer 14 may not be limited in the present disclosure.

At block S322: the gate-insulating layer may be formed on the semi-conductive layer.

The gate-insulating layer 15 may be formed on the semi-conductive layer 14. The gate-insulating layer 15 may be made from silicon nitride, silicon oxide, silicon oxynitride, or any other stable material having similar properties. The material of the gate-insulating layer 15 may not be limited in the present disclosure.

At block S323: the gate electrode may be formed on the gate-insulating layer.

The gate electrode 16 may be formed on the gate-insulating layer 15. In this embodiment, the gate electrode 16 may be formed by means of sputtering and patterning processes. The gate electrode 16 may be a metal layer including material such as aluminum, molybdenum, tungsten, or the like. For example, it is possible to form the gate electrode 16 by sputtering a metal layer on the gate-insulating layer 15 and further patterning the metal layer. The material and the manufacturing method of the gate electrode 16 may not be limited in the present disclosure.

After the TFT device has been formed, the following blocks may be continued to proceed.

At block S330: a dielectric layer may be formed on the TFT device and a portion of the buffer layer in each stretchable region.

The dielectric layer 17 may be formed on the TFT device and a portion of the buffer layer 13 in each stretchable region B. That is, the dielectric layer 17 may be formed in each pixel region A and each stretchable region B.

At block S340: a portion of the dielectric layer in each stretchable region may be patterned.

Figure 7:
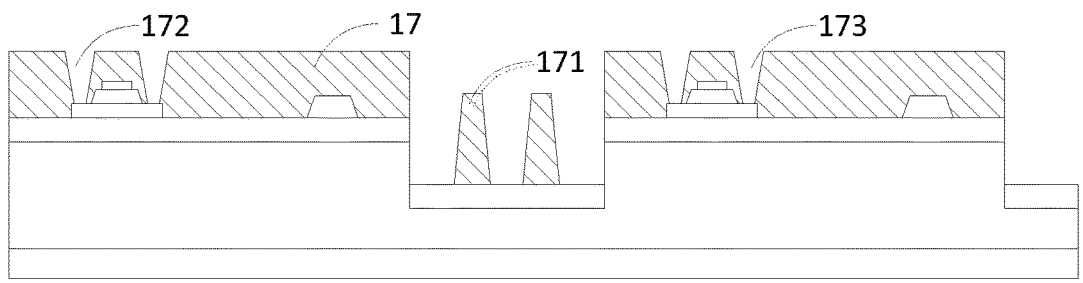
FIG. 7 is a structural view of the dielectric layer according to the embodiment shown in FIG. 4.

Referring to FIG. 7, a portion of the dielectric layer 17 in each stretchable region B may be patterned, in such a way that at least one columnar protrusion 171 may be formed with a portion of the dielectric layer 17 in each stretchable region B. That is to say, the portion of the dielectric layer 17 in each stretchable region B may form the at least one columnar protrusion 171. In this way, the at least one columnar protrusion 171 may be formed in each stretchable region B, and the portion part of the buffer layer 13 in each stretchable region B may be exposed. Meanwhile, the portion of the dielectric layer 17 in each pixel region A may be patterned to define holes 172 and 173, in order to expose the semi-conductive layer 14. The holes 172 and 173 may be respectively used to manufacture the source electrode and the drain electrode subsequently.

The columnar protrusion 171 is merely an illustrative example. Similar structures configured to increase the length of the conducting wire between two adjacent pixel regions may also be used and fall into the protection scope of the present disclosure.

Optionally, a parabolic protrusion, a semi-cylindrical protrusion or a wavy protrusion may also be used to replace the columnar protrusion 171 in the present embodiment.

At block S350: a conductive layer may be formed on the dielectric layer.

The conductive layer 18 may be formed on the dielectric layer 17. The conductive layer 18 may also be formed on the exposed buffer layer 13 in each stretchable region B. In this embodiment, the conductive layer 18 may be formed on the dielectric layer 17 by means of the sputtering. However, in other embodiments, the conductive layer 18 may be formed on the dielectric layer 17 by using other methods. The forming method of the conductive layer may not be limited in the present disclosure.

At block S360: the conductive layer may be patterned to form the source electrode or the drain electrode, and form the conducting wire connecting the two adjacent pixel regions.

Figure 8:
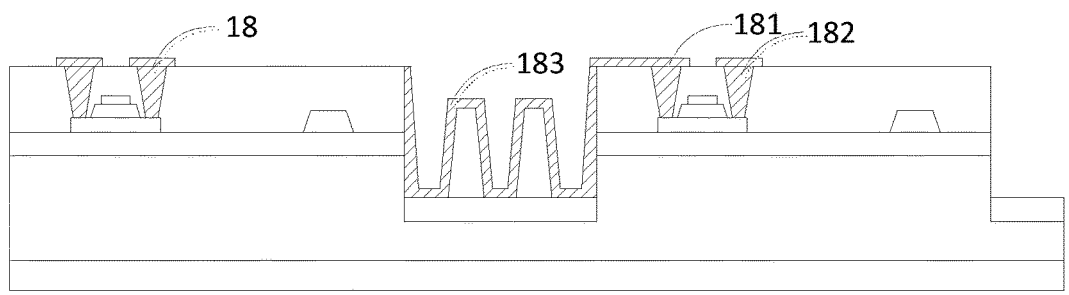
FIG. 8 is a structural view of the conductive layer according to the embodiment shown in FIG. 4.

Referring to FIG. 8, the conductive layer 18 may be patterned to form the source electrode 181, the drain electrode 182, and the conducting wire 183 connecting the two adjacent pixel regions. The conducting wire 183 may be routed along surfaces respectively of the buffer layer 13, the dielectric layer 17 and the columnar protrusion 171, and connect the two adjacent pixel regions A. In this way, the length of the conducting wire 183 may be greater than the distance between the two adjacent pixel regions A.

In this embodiment, the conducting wire 183 may be connected to the source electrode 181, the drain electrode 182, a common electrode, or the like. In this embodiment, on the stretchable display panel, the wirings between the two adjacent pixel regions A may be arranged in this way. In other embodiments, the columnar protrusion 171 or similar structures may be provided between some of the two adjacent pixel regions on the display panel, in order to increase the flexibility of the display panel. All these belong to the protection scope of the present disclosure.

At block S370: an OLED device may be formed on a portion of the conductive layer in each pixel region.

The OLED device may be formed on a portion of the conductive layer 18 in each pixel region A. The OLED device may include a cathode layer, a light-emitting layer, and an anode layer.

For example, the OLED device may be manufactured by using the following methods. The method recited here are merely illustrative examples. It can be understood that, other methods can also be used to manufacture the OLED device. Besides, the configuration of the OLED device recited here is merely an illustrative example. In fact, the OLED device may have any other suitable configuration. The manufacturing method and the configuration of the OLED device may not be limited in the present disclosure.

Figure 9:
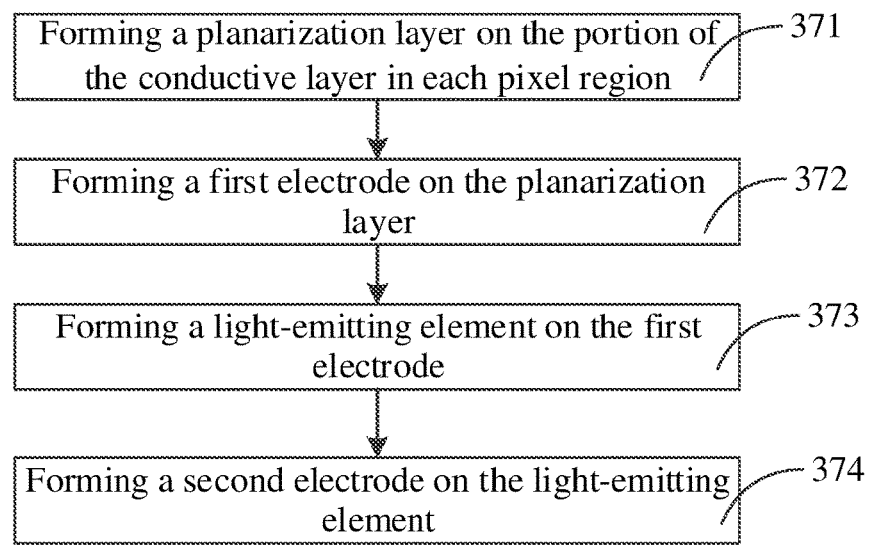
FIG. 9 is a flow chart of the block S370 shown in FIG. 4.
Figure 10:
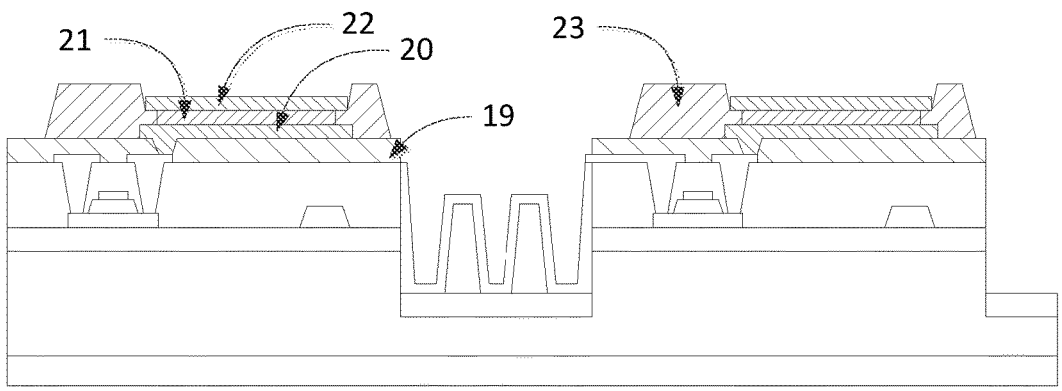
FIG. 10 is a structural view of the OLED device according to the embodiment shown in FIG. 9.

Referring to FIG. 9 and FIG. 10, a flow chart of the block S370 shown in FIG. 4 is depicted in FIG. 9, and a structural view of the OLED device according to the embodiment shown in FIG. 9 is depicted in FIG. 10.

At block S371: a planarization layer may be formed on the portion of the conductive layer in each pixel region.

The planarization layer 19 may be formed on the portion of the conductive layer 18 in each pixel region A. In fact, at least a portion of the dielectric layer 17 may still be exposed after the conductive layer 18 is patterned. That is, it should be understood that, the planarization layer 19 here may be formed on both the portion of the conductive layer 18 and the portion of the dielectric layer 17 in each pixel region A. The planarization layer 19 may be further patterned such that the drain electrode 182 may be exposed.

At block S372: a first electrode may be formed on the planarization layer.

The first electrode 20 may be formed on the planarization layer 19. The first electrode 20 may be electrically coupled to the drain electrode 182, in order to receive signals transmitted from the drain electrode 182, and to drive the OLED device. The first electrode 20 may be used as the anode layer or the cathode layer of the OLED device.

At block S373: a light-emitting element may be formed on the first electrode.

A bank layer 23 configured to define a light-emitting pixel region is formed on the first electrode 20. Then the light-emitting element 21 may be manufactured later.

Electrons and holes may be injected into the light-emitting element 21 from the cathode or the anode. The injected electrons and holes may be transmitted in the cathode or the anode respectively, and recombine in the light-emitting element 21. In this way, molecules in a light-emitting layer of the light-emitting element 21 may be excited to produce excitons, and excitons may undergo radiation decay, thereby emitting lights.

At block S374: a second electrode may be formed on the light-emitting element.

The second electrode 22 may be formed on the light-emitting element 21. The second electrode 22 may be used as the anode layer or the cathode layer. In this case, one of the first electrode 20 and the second electrode 22 may be the anode layer of the OLED device, and the other of the first electrode 20 and the second electrode 22 may be the cathode layer of the OLED device.

After the above blocks, the manufacturing method of the stretchable display panel may further include the following blocks.

Figure 11:
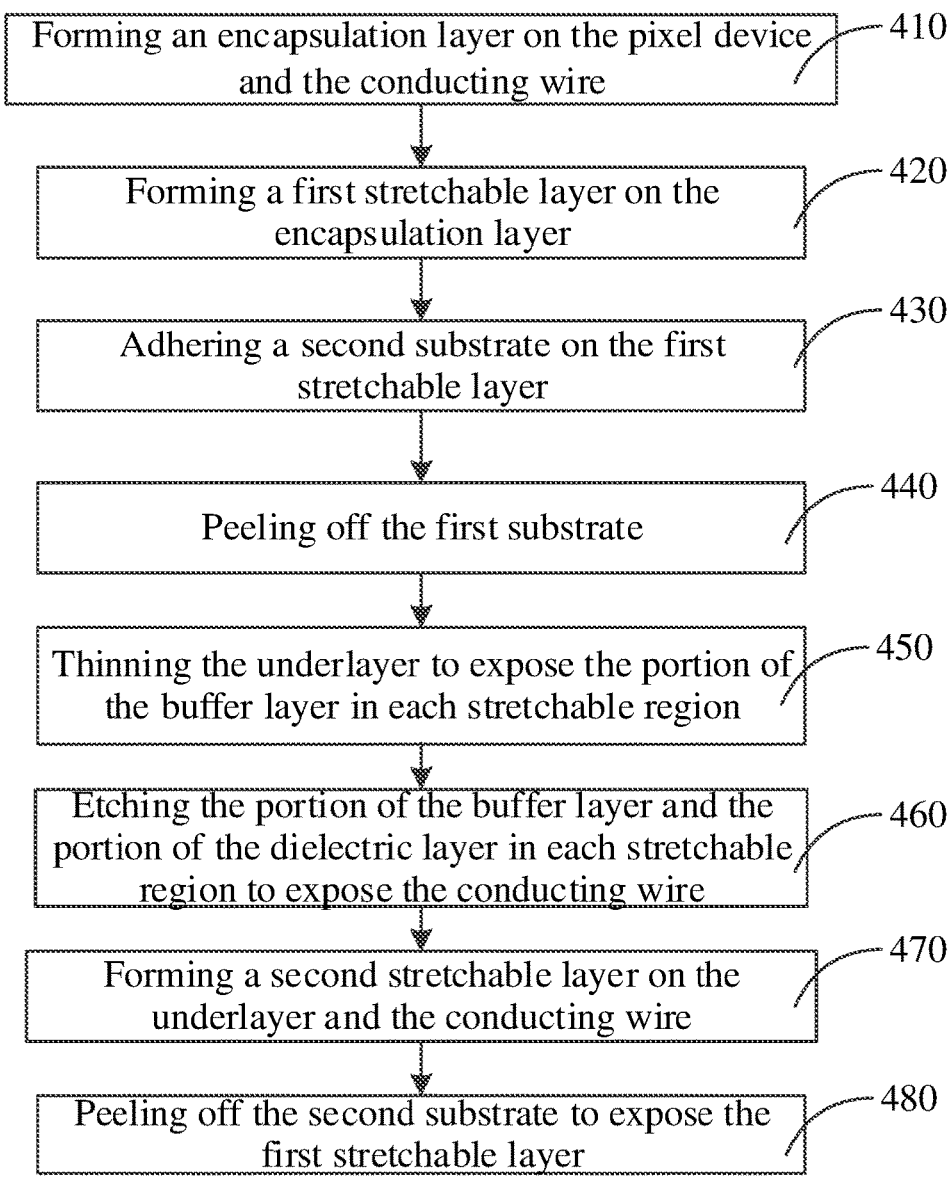
FIG. 11 is a flow chart showing blocks following the blocks shown in FIG. 1.

Referring to FIG. 11, a flow chart showing blocks following the blocks shown in FIG. 1 is further depicted in FIG. 11.

At block S410: an encapsulation layer may be formed on the pixel device and the conducting wire.

Figure 12:
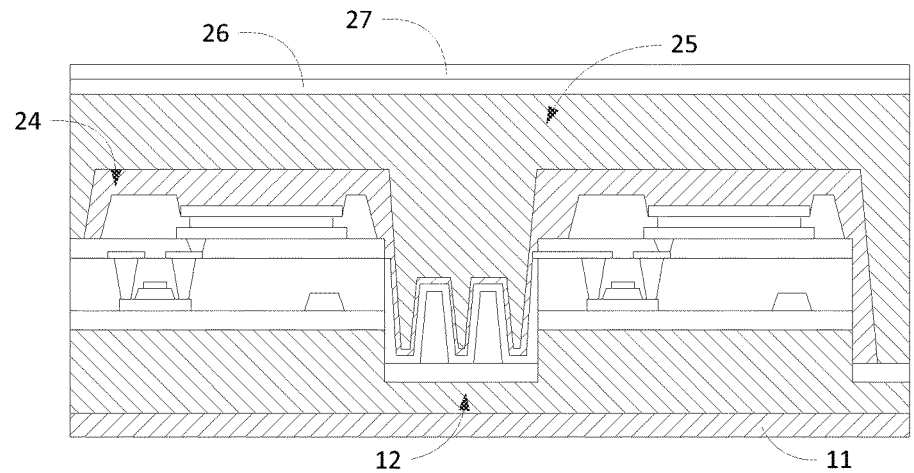
FIG. 12 is a structural view of the encapsulation layer, the first stretchable layer and the second substrate according to the embodiment shown in FIG. 11.

Referring to FIG. 12, the encapsulation layer 24 may be formed on the pixel device and the conducting wire 183. That is, the encapsulation layer 24 may be formed on the planarization layer 19, the bank layer 23 and the second electrode 22 in each pixel region A, and the conducting wire 183 in each stretchable region B. The encapsulation layer 24 may cover the pixel device and the conducting wire 183, in order to prevent the water and the oxygen from penetrating into the pixel device and the conducting wire 183, thereby improving the performance of the display panel. The pixel device may include the TFT device and the OLED device.

At block S420: a first stretchable layer may be formed on the encapsulation layer.

Referring to FIG. 12, the first stretchable layer 25 may be formed on the encapsulation layer 24, in order to protect the encapsulation layer 24 and increase the stretchability of the stretchable display panel. The first stretchable layer 25 may be made from stretchable material for the purpose of encapsulation, such as polydimethylsiloxane (PDMS), or any other suitable material having similar stable physical and chemical properties. The material of the first stretchable layer 25 may not be limited in the present disclosure.

At block S430: a second substrate may be adhered on the first stretchable layer.

Referring to FIG. 12, the second substrate 27 may be adhered on the first stretchable layer 25. More specifically, an adhesion layer 26 may be firstly provided on the first stretchable layer 25, then the second substrate 27 may be adhered on the adhesion layer 26. The second substrate 27 may be the substrate similar to the first substrate 11, and may not be described in detail any more.

At block S440: the first substrate may be peeled off.

At block S450: the underlayer may be thinned, in order to expose the buffer layer in each stretchable region.

Figure 13:
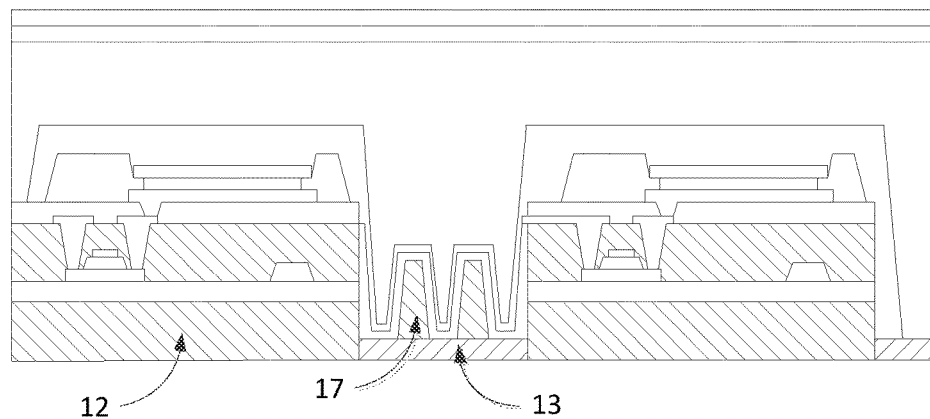
FIG. 13 is a structural view of the underlayer and the buffer layer according to the embodiment shown in FIG. 11.

Referring to FIG. 13, the second portion of the underlayer 12 may be thinned, in order to expose the buffer layer 13 in each stretchable region B. In this way, the second portion underlayer 12 in in each stretchable region B may be removed by thinning, and thus the first portions of the underlayers 12 respectively in two adjacent pixel regions A may be separated from each other.

At block S460: the portion of the buffer layer and the portion of the dielectric layer in each stretchable region may be etched, such that the conducting wire may be exposed.

Figure 14:
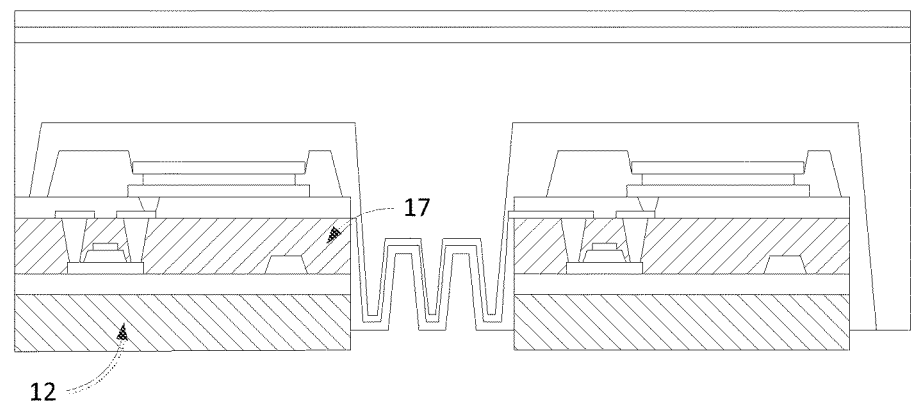
FIG. 14 is a structural view of the conducting wires according to the embodiment shown in FIG. 11.

Referring to FIG. 14, the portion of the buffer layer 13 and the portion of the dielectric layer 17 in each stretchable region B may be etched, such that the conducting wire 183 may be exposed.

At block 470: a second stretchable layer may be formed on the underlayer and the conducting wire.

Referring to FIG. 14, the second stretchable layer 28 may be formed on the underlayer 12 and the conducting wire 183. The second stretchable layer 28 may be made from materials similar to those from which the first stretchable layer may be made. In this way, the conducting wire 183 may fully stretch in the stretchable materials.

At block 480: the second substrate may be peeled off, thereby exposing the first stretchable layer.

Referring to FIG. 14, the second substrate 27 may be peeled off, thereby exposing the first stretchable layer 25.

Figure 15:
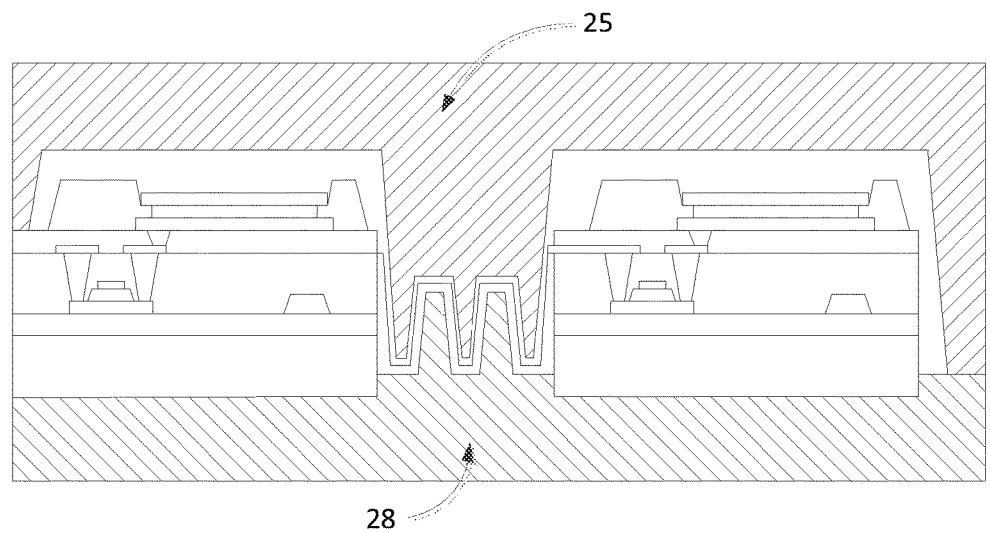
FIG. 15 is a structural view of a stretchable display panel according to one embodiment of the present disclosure.

FIG. 15 is a structural view of a stretchable display panel according to one embodiment of the present disclosure.

For better understanding the components corresponding to the numbers, please refer to FIGS. 3, 5-7, 9 and 11-14.

The stretchable display panel may include a plurality of pixel regions A and a plurality of stretchable regions B; wherein each stretchable region B is located between two adjacent pixel regions A. A pixel device may be arranged in each pixel region, and a conducting wire 183 connecting two adjacent pixel regions A may be arranged in each stretchable region B. A length of the conducting wire 183 may be greater than a distance between two adjacent pixel regions A.

More specifically, an underlayer 12, a buffer layer 13, a TFT device (including a semi-conductive layer 14, a gate-insulating layer 15, a gate electrode 16 and a conductive layer 18), a dielectric layer 17, a planarization layer 19, and an OLED device (including a first electrode 20, a light-emitting element 21, a second electrode 22 and a bank layer 23) successively stacked on one another may be arranged in each pixel region A. The conductive layer 18 may be patterned to form the source electrode 181, the drain electrode 182, and the conducting wire 183 connecting the two adjacent pixel regions, as stated above. The pixel device may substantially include the gate electrode 16, the source electrode 181, the drain electrode 182, the gate-insulating layer 15, the semi-conductive layer 14 and the OLED device. Each stretchable region B may have at least one columnar protrusion 171 arranged therein. The conducting wire 183 may be arranged on a surface of the at least one columnar protrusion 171. In this case, the first portions of the underlayer 12 respectively in two adjacent pixel regions A may be separated from each other.

The columnar protrusion 171 is merely an illustrative example. Similar structures configured to increase the length of the conducting wire between two adjacent pixel regions may also be used and fall into the protection scope of the present disclosure.

Optionally, a parabolic protrusion, a semi-cylindrical protrusion or a wavy protrusion may also be used to replace the columnar protrusion 171 in the present embodiment.

An encapsulation layer 24 may be formed at one side of the stretchable display panel that is away from the underlayer 12, and each pixel region A and each stretchable region B are covered by the encapsulation layer 24. That is to say, one side of the stretchable display panel at which the pixel device is arranged in each pixel region A, and at which the conducting wire 183 is arranged in each stretchable region B may be covered by the encapsulation layer 24. A first stretchable layer 25 may be formed on the encapsulation layer 24. A second stretchable layer 28 may be formed at one side of the underlayer 12 and the at least one columnar protrusion 171 that is opposite to the first stretchable layer 25. In this way, the conducting wire 183 may fully stretch in the stretchable material. It could be understood that, in this embodiment, the first stretchable layer 25 and the second stretchable layer 28 are in fact located at two opposite sides of the stretchable display panel, and each of the first stretchable layer 25 and the second stretchable layer 28 covers each pixel region A and each stretchable region B.

Furthermore, by arranging the columnar protrusion or similar structures, and filling stretchable material in the columnar protrusion or the similar structures, the deformation amount of the stretchable display panel may be increased. In this way, the stretchable display panel may be deformed in a plurality of dimensions without damaging the display characteristic of the stretchable display panel. Therefore, the stretchable display panel may be applied to the display application having greater deformation. The display substrate and the display apparatus manufactured according to the technical motivation acquired from the stretchable display panel of the present disclosure should be covered within the protection scope of the present disclosure.

Figure 16:
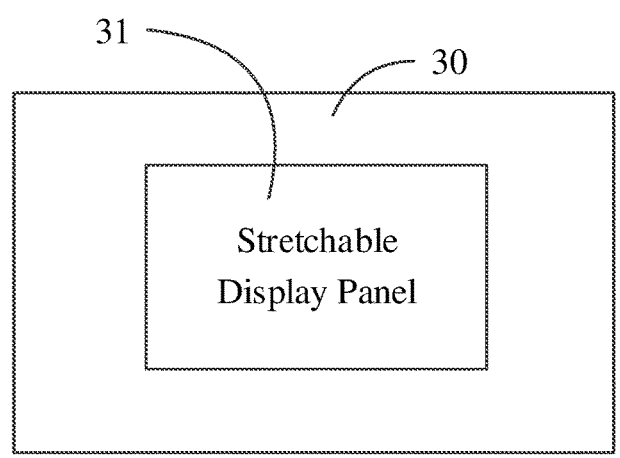
FIG. 16 is a structural view of a stretchable display apparatus according to one embodiment of the present disclosure.

Referring to FIG. 16, a structural view of a stretchable display apparatus according to one embodiment of the present disclosure is depicted.

The stretchable display apparatus 30 may substantially include a stretchable display panel 31 which may be acquired by the manufactured method described above, or may be the display panel described above. The display panel will not be described in details any more.

Compared with the related art, a manufacturing method of the stretchable display panel may be provided in the present disclosure. The manufacturing method of the stretchable display panel may substantially include: providing a first substrate; defining a plurality of pixel regions and a plurality of stretchable regions in the first substrate, each stretchable region being located between two adjacent pixel regions; forming a pixel device in each pixel region, and forming a conducting wire connecting two adjacent pixel regions in each stretchable region; wherein a length of the conducting wire may be greater than a distance between two adjacent pixel regions. By arranging the conducting wire having a length greater than a distance between two adjacent pixel regions in each stretchable region between two adjacent pixel regions, the stretchable display panel may have a great amount of deformation. In this way, the stretchable display panel may be deformed in a plurality of dimensions without damaging the display characteristic of the stretchable display panel. Therefore, the stretchable display panel may be applied to the display application having greater deformation.

The descriptions above are merely the embodiments of the present disclosure, and are not intended to limit the protection scope of the present disclosure. In fact, one skilled in the art may make many equivalents and modifications based on the specification and the drawings of the present disclosure, or directly or indirectly apply the technical solution to other relevant technical field. All these shall all be covered within the protection of the disclosure.

What is claimed is:

1. A stretchable display panel, comprising;
    a plurality of pixel regions, each of which has a pixel device arranged therein; and
    a plurality of stretchable regions; wherein each stretchable region is located between two adjacent pixel regions, and a conducting wire connecting two adjacent pixel regions is arranged in each stretchable region; a length of the conducting wire is greater than a distance between two adjacent pixel regions; wherein at least one columnar protrusion is arranged in each stretchable region; the conducting wire connecting the two adjacent pixel regions is arranged on a surface of the at least one columnar protrusion;
    wherein one side of the stretchable display panel is provided with a first stretchable layer, and the first stretchable layer covers each pixel region and each stretchable region; an opposite side of the stretchable display panel that is opposite to the first stretchable layer is covered by a second stretchable layer, and the second stretchable layer covers each pixel region and each stretchable region; and
    wherein the at least one columnar protrusion is formed by the second stretchable layer.

2. The stretchable display panel as described in claim 1, wherein one side of the stretchable display panel at which the pixel device is arranged in each pixel region, and at which the conducting wire is arranged in each stretchable region is covered by an encapsulation layer; the first stretchable layer is arranged on the encapsulation layer.

3. The stretchable display panel as described in claim 1, wherein an underlayer, a buffer layer, a thin film transistor device, a dielectric layer, a planarization layer, and an organic light emitting diode device successively stacked on one another are arranged in each pixel region;

first portions of the underlayers respectively in two adjacent pixel regions are separated from each other.

4. The stretchable display panel as described in claim 3, wherein the thin film transistor device comprises a semi-conductive layer, a gate insulating layer, a gate electrode, and a conductive layer; the semi-conductive layer, the gate insulating layer, the gate electrode, and the dielectric layer are successively stacked on one another;
   a first hole and a second hole are defined in the dielectric layer, such that the semi-conductive layer is exposed via the first hole and the second hole; the conductive layer is arranged on the dielectric layer to form a source electrode and a drain electrode.

5. The stretchable display panel as described in claim 4, wherein the organic light emitting diode device comprises a first electrode, a light-emitting element and a second electrode successively stacked on one another; the first electrode is arranged on the planarization layer, and electrically coupled to the drain electrode.

6. The stretchable display panel as described in claim 5, wherein the organic light emitting diode device further comprises a bank layer arranged on the first electrode and configured to define a light-emitting pixel region; the light-emitting element is defined in the light-emitting pixel region.

7. A stretchable display apparatus, comprising a stretchable display panel;
   wherein the stretchable display panel comprises:
      a plurality of pixel regions, each of which has a pixel device arranged therein; and
      a plurality of stretchable regions; wherein each stretchable region is located between two adjacent pixel regions; at least one columnar protrusion is arranged in each stretchable region, and a conducting wire connecting the two adjacent pixel regions is arranged on a surface of the at least one columnar protrusion such that a length of the conducting wire is greater than a distance between two adjacent pixel regions;
      wherein one side of the stretchable display panel is provided with a first stretchable layer, and the first stretchable layer covers each pixel region and each stretchable region; an opposite side of the stretchable display panel that is opposite to the first stretchable layer is covered by a second stretchable layer, and the second stretchable layer covers each pixel region and each stretchable region; and
      wherein the at least one columnar protrusion is formed by the second stretchable layer.

8. The stretchable display apparatus as described in claim 7, wherein one side of the stretchable display panel at which the pixel device is arranged in each pixel region, and at which the conducting wire is arranged in each stretchable region is covered by an encapsulation layer; the first stretchable layer is arranged on the encapsulation layer.

9. The stretchable display apparatus as described in claim 7, wherein an underlayer, a buffer layer, a thin film transistor device, a dielectric layer, a planarization layer, and an organic light emitting diode device successively stacked on one another are arranged in each pixel region;
   first portions of the underlayer respectively in two adjacent pixel regions are separated from each other.

10. The stretchable display apparatus as described in claim 9, wherein the thin film transistor device comprises a semi-conductive layer, a gate insulating layer, a gate electrode, and a conductive layer; the semi-conductive layer, the gate insulating layer, the gate electrode, and the dielectric layer are successively stacked on one another;
   a first hole and a second hole are defined in the dielectric layer, such that the semi-conductive layer is exposed via the first hole and the second hole; the conductive layer is arranged on the dielectric layer to form a source electrode and a drain electrode.

11. The stretchable display apparatus as described in claim 10, wherein the organic light emitting diode device comprises a first electrode, a light-emitting element and a second electrode successively stacked on one another; the first electrode is arranged on the planarization layer, and electrically coupled to the drain electrode;
   the organic light emitting diode device further comprises a bank layer arranged on the first electrode and configured to define a light-emitting pixel region; the light-emitting element is defined in the light-emitting pixel region.

12. A manufacturing method for a stretchable display panel, comprising:
   providing a first substrate;
   forming an underlayer on the first substrate; and
   etching the underlayer to form the plurality of pixel regions and the plurality of stretchable regions each of which is located between two adjacent pixel regions; wherein a thickness of a first portion of the underlayer located in each pixel region is greater than a thickness of a second portion of the underlayer located in each stretchable region;
   forming a buffer layer on the underlayer;
   forming a thin film transistor device on a portion of the buffer layer in each pixel region;
   forming a dielectric layer on the thin film transistor device and a portion of the buffer layer in each stretchable region;
   patterning a portion of the dielectric layer in each stretchable region, such that at least one first columnar protrusion is formed with the dielectric layer;
   forming a conductive layer on the dielectric layer;
   patterning the conducting layer to form a source electrode or a drain electrode, and a conducting wire connecting the two adjacent pixel regions; and
   forming an organic light emitting diode device on a portion of the conductive layer in each pixel region;
   wherein a length of the conducting wire is greater than a distance between two adjacent pixel regions;
   wherein the method further comprises:
   forming an encapsulation layer on the pixel device and the conducting wire;
   forming a first stretchable layer on the encapsulation layer;
   adhering a second substrate on the first stretchable layer;
   peeling off the first substrate;
   thinning the underlayer to expose the portion of the buffer layer in each stretchable region;
   etching the portion of the buffer layer and the portion of the dielectric layer in each stretchable region to expose the conducting wire;
   forming a second stretchable layer on the underlayer and the conducting wire, wherein the second stretchable layer forms at least one second columnar protrusion, and the conducting wire connecting the two adjacent pixel regions is arranged on a surface of the at least one second columnar protrusion; and
   peeling off the second substrate to expose the first stretchable layer.

13. The manufacturing method as described in claim 12, wherein forming the thin film transistor device on the portion of the buffer layer in each pixel region comprises:

forming a semi-conductive layer on the buffer layer;

forming a gate-insulating layer on the semi-conductive layer; and forming a gate electrode on the gate-insulating layer.

14. The manufacturing method as described in claim 12, wherein forming the organic light emitting diode device on the portion of the conductive layer in each pixel region comprises:

forming a planarization layer on the portion of the conductive layer in each pixel region;

forming a first electrode on the planarization layer;

forming a light-emitting element on the first electrode; and forming a second electrode on the light-emitting element.

* * * * *